US010090246B2

(12) United States Patent
Liu (10) Patent No.: US 10,090,246 B2
(45) Date of Patent: Oct. 2, 2018

(54) METAL INTERCONNECT STRUCTURE AND FABRICATION METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventor: Jiquan Liu, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/242,560

(22) Filed: Aug. 21, 2016

(65) Prior Publication Data

US 2017/0062344 A1    Mar. 2, 2017

(30) Foreign Application Priority Data

Sep. 2, 2015   (CN) .......................... 2015 1 0555776

(51) Int. Cl.
*H01L 23/532*    (2006.01)
*H01L 21/768*    (2006.01)
*H01L 23/528*    (2006.01)

(52) U.S. Cl.
CPC .. *H01L 23/53238* (2013.01); *H01L 21/76804* (2013.01); *H01L 21/76846* (2013.01); *H01L 21/76859* (2013.01); *H01L 21/76883* (2013.01); *H01L 23/5283* (2013.01); *H01L 23/53295* (2013.01)

(58) Field of Classification Search
CPC ......... H01L 23/53238; H01L 21/76846; H01L 23/5283
See application file for complete search history.

(56) References Cited

U.S. PATENT DOCUMENTS 8,771,804 B2 *   7/2014   Dordi .................. H01L 21/0206
                                                    427/532

* cited by examiner

*Primary Examiner* — Amar Movva
(74) *Attorney, Agent, or Firm* — Anova Law Group, PLLC (57) ABSTRACT

The present disclosure provides metal interconnect structures and fabrication methods thereof. An exemplary fabrication method of the metal interconnect structure includes providing a semiconductor substrate having a surface; forming a first metal layer on the surface of the semiconductor substrate; forming a dielectric layer on the first metal layer; forming contact through holes exposing a surface of the first metal layer, and trenches being over the contact through holes and connecting with the contact through holes in the dielectric layer; forming a first metal barrier layer on inner surfaces of the trenches and the contact through holes; forming a metal nitride barrier layer covering the first metal barrier layer on the inner surfaces of the trenches and the contact through holes; and forming a second metal layer to fill the trenches and the contact through holes.

16 Claims, 10 Drawing Sheets

METAL INTERCONNECT STRUCTURE AND FABRICATION METHOD THEREOF

CROSS-REFERENCES TO RELATED APPLICATIONS

This application claims the priority of Chinese patent application No. 201510555776.4, filed on Sep. 2, 2015, the entirety of which is incorporated herein by reference.

FIELD OF THE INVENTION

The present invention generally relates to the field of semiconductor technology and, more particularly, relates to metal interconnect structures and fabrication processes thereof.

BACKGROUND

With the continuous development of integrated circuit (IC) manufacturing technology, the volume of the semiconductor devices has become smaller and smaller; and the parasitic capacitance among metals in ICs has become larger and larger. Thus, the resistance-capacitance (RC) delay issue has become more and more prominent. To solve the RC delay issue, a copper interconnect technique has been used to substitute the conventional aluminum interconnect technique because the resistivity of copper is smaller than the resistivity of aluminum.

In the ICs having the conventional aluminum interconnect structures, the metal lines are formed by etching the metal, followed by a dielectric material filling process, and a chemical mechanical polishing (CMP) process, etc. When the material of the metal lines is changed from aluminum to copper, because copper is very difficult to etch, an embedding process is a key step of the fabrication of the copper wires in the copper interconnect structure. The embedding process is also referred as a Damascene process.

Forming the metal interconnect structure by the embedding process does not need a copper etching process. FIGS. 1-4 illustrate semiconductor structures corresponding to certain stages of an existing embedding process for forming a metal interconnect structure. As shown FIG. 1, the embedding process includes providing a semiconductor substrate (not shown); forming a first metal layer 101 on the semiconductor substrate; forming a dielectric layer 102 covering the first metal layer 101; and forming contact through holes 103 and trenches 104 connecting with the contact through holes 103 in the dielectric layer 102. The cross-section of the contact through holes 103 and the trenches 104 presents a Damascene morphology.

Figure 1:
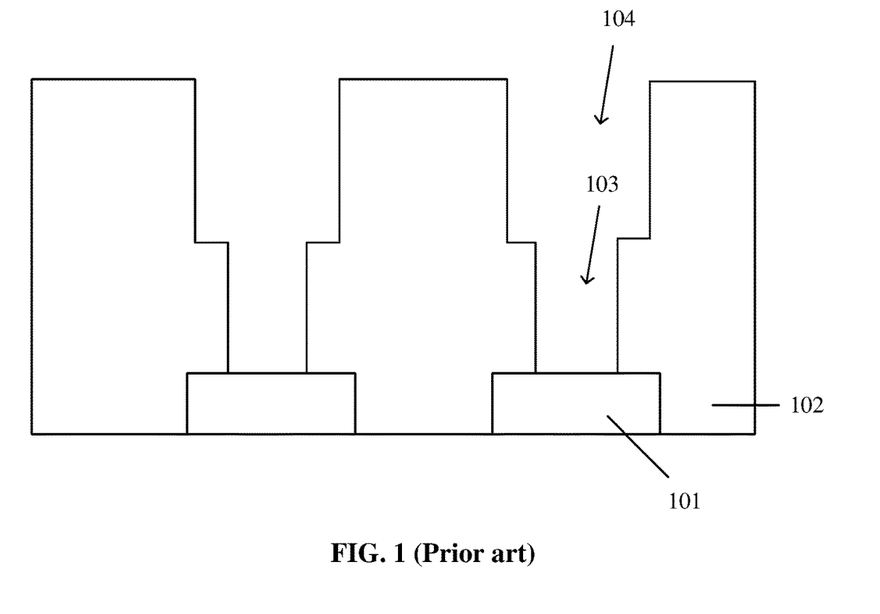
FIGS. 1-4 illustrate structures corresponding to certain stages of an existing fabrication method of a metal interconnect structure.
Figure 2:
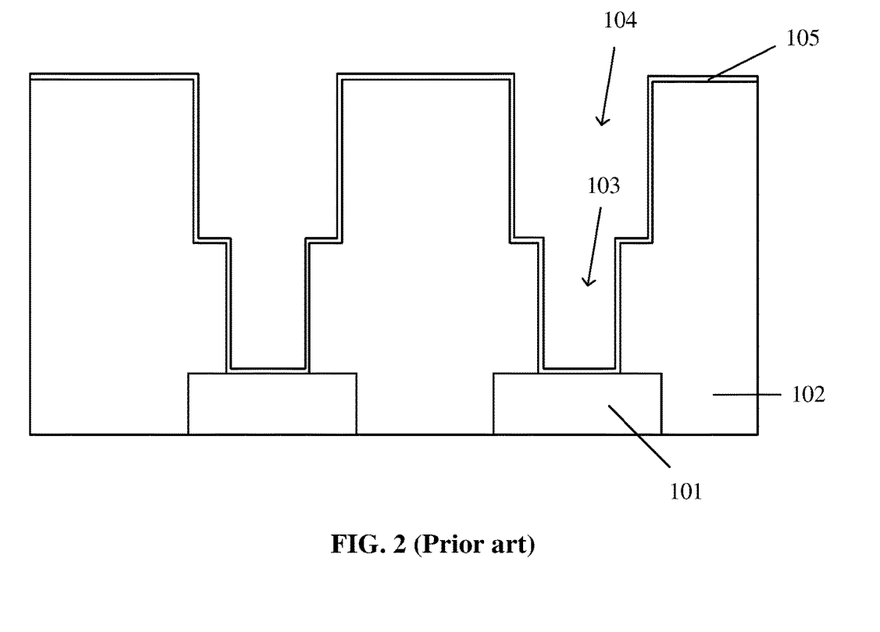
Figure 3:
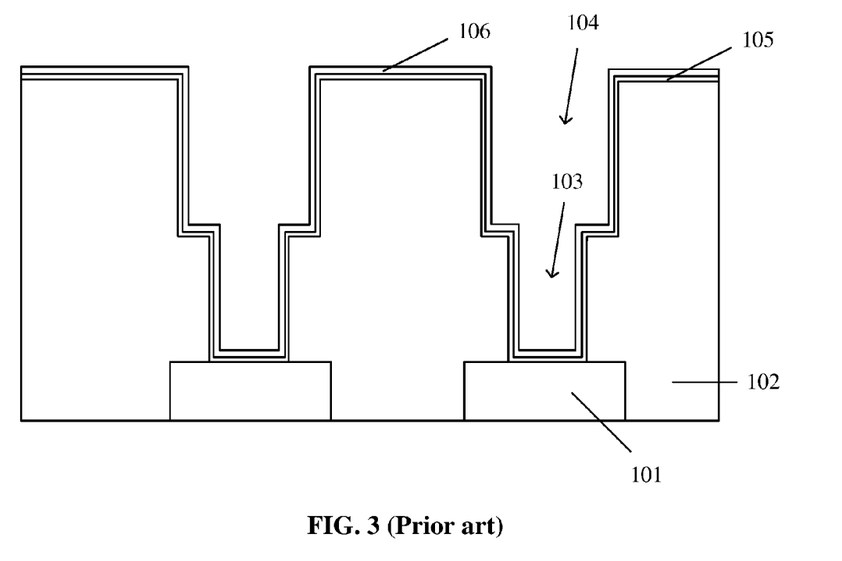
Figure 4:
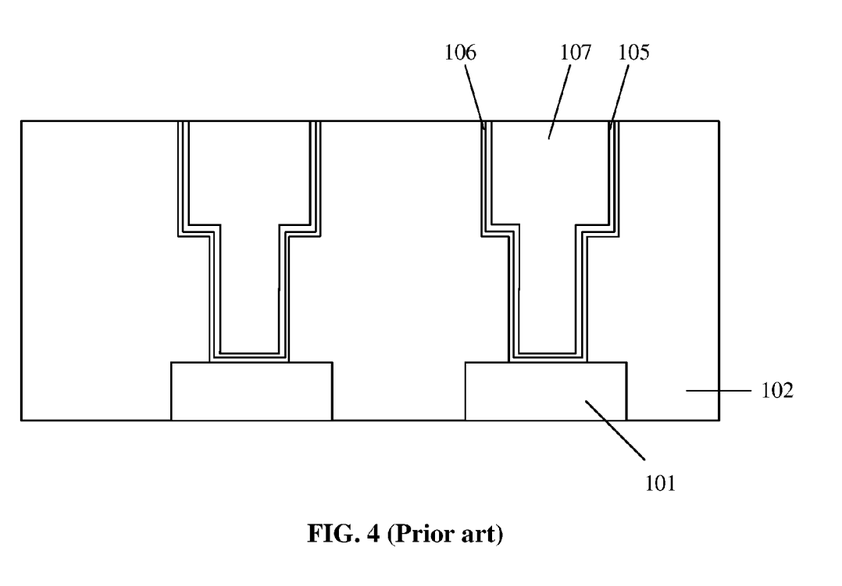

As shown in FIG. 2, the method also includes forming a metal nitride barrier layer 105 on the side surfaces of the contact through holes 103 and the trenches 104. Further, as shown in FIG. 3, the method also includes forming a copper seed layer 106 on the metal nitride barrier layer 105. Further, as shown in FIG. 4, the method also includes forming a copper metal layer (not labeled) on the copper seed layer 106 by an electro-chemical plating (ECP) method. The metal copper layer is referred as a second metal layer 107 (the copper seed layer 106 is also claimed as a portion of the second metal layer 107). Then, the metal copper layer, the copper seed layer 106 and the metal nitride barrier layer 105 may be planarized by a chemical mechanical polishing (CMP) process, and a flat and smooth surface is obtained.

However, in the metal interconnect structures formed by the existing methods, the resistance of the metal nitride barrier layer is relatively high. The relatively high resistance increases the resistance between the first metal layer and the second metal layer. Accordingly, the RC delay issue becomes more severe. The disclosed device structures and methods are directed to solve one or more problems set forth above and other problems in the art.

BRIEF SUMMARY OF THE DISCLOSURE

One aspect of the present disclosure includes a method for fabricating a metal interconnect structure. The method includes providing a semiconductor substrate having a surface; forming a first metal layer on the surface of the semiconductor substrate; forming a dielectric layer on the first metal layer; forming contact through holes exposing a surface of the first metal layer and trenches being over the contact through holes and connecting with the contact through holes in the dielectric layer; forming a first metal barrier layer on inner surfaces of the trenches and the contact through holes; forming a metal nitride barrier layer covering the first metal barrier layer on the inner surfaces of the trenches and the contact through holes; and forming a second metal layer to fill the trenches and the contact through holes.

Another aspect of the present disclosure includes a metal interconnect structure. The metal interconnect structure includes a first metal layer; a dielectric layer formed on the first metal layer; a first metal barrier layer formed in the dielectric layer and on the first metal layer; a metal nitride barrier layer covering the first metal barrier layer; and a second metal layer formed over the metal nitride barrier layer. The first metal barrier layer is formed by forming contact through holes exposing a surface of the first metal layer and trenches being over the contact through holes and connecting with the contact through holes in the dielectric layer; and forming the first metal barrier layer on the inner surfaces of the trenches and the contact through holes.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

In the existing semiconductor manufacturing methods, a metal nitride barrier layer is usually formed to prevent copper from diffusing into the dielectric layer. In the existing methods for forming the metal nitride barrier layer, after forming contact through holes and trenches, the metal nitride barrier layer is usually directly formed on inner surfaces of the contact through holes and the trenches. However, after forming the contact through holes and the trenches, the surface of the first metal layer exposed by the contact through holes may have many contaminations.

Such contaminations are often caused by the fabrication process of the contact through holes and the trenches; and often contain oxygen and nitrogen. When such contaminations exist, if the metal nitride barrier layer is formed directly, the contaminations may be covered (or sealed) by the metal nitride barrier layer on the first metal layer. After subsequently filling the trenches and contact through holes with a second metal, the contaminations may still exist, and may not be eliminated. The contaminations covered (sealed) on the first metal layer increases the contact resistance between the first metal layer and the second metal layer. Thus, the conductive performance of the metal interconnect structure may be reduced; and the entire metal interconnect structure may have a severe RC delay issue.

The present disclosure provides an improved fabrication process. FIGS. 5-8 illustrate semiconductor structures corresponding certain stages of an exemplary fabrication process of a metal interconnect structure consistent with the disclosed embodiments.

Figure 5:
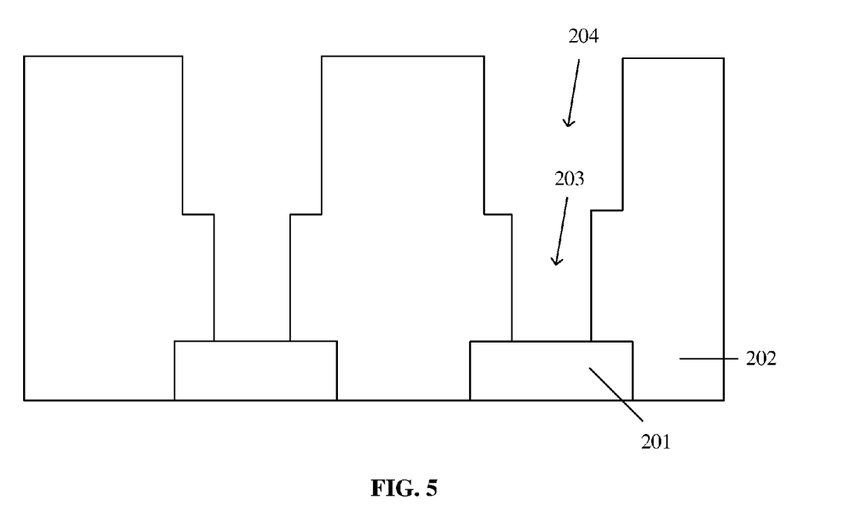
FIGS. 5-8 illustrate semiconductor structures corresponding certain stages of an exemplary fabrication process of a metal interconnect structure consistent with the disclosed embodiments.

As shown in FIG. 5, at the beginning of fabrication process, a semiconductor substrate (not shown) is provided; and a first metal layer 201 is formed on the semiconductor substrate. Further, a dielectric layer 202 may be formed on the first metal layer 201.

The semiconductor substrate may be made of any appropriate semiconductor material, such as silicon, polysilicon, silicon on insulator (SOI), germanium on insulator (GOI), silicon germanium, carborundum, indium antimonite, lead telluride, indium arsenide, indium phosphide, gallium arsenide, gallium antimonite, alloy semiconductor, or a combination thereof. In one embodiment, the semiconductor substrate is made of silicon. The semiconductor substrate provides a base for subsequent structures and processes.

Further, semiconductor structures (not shown) may be formed on the semiconductor substrate. The semiconductor structures may be active semiconductor devices or passive semiconductor devices.

Further, contact through holes 203 and trenches 204 may be formed in the dielectric layer 202. The contact through holes 203 may expose the surface of the first metal layer 201. The contact through holes 203 may be connected with the trenches 204. As shown in FIG. 5, the trenches 204 may be on the contact through holes 203.

Figure 6:
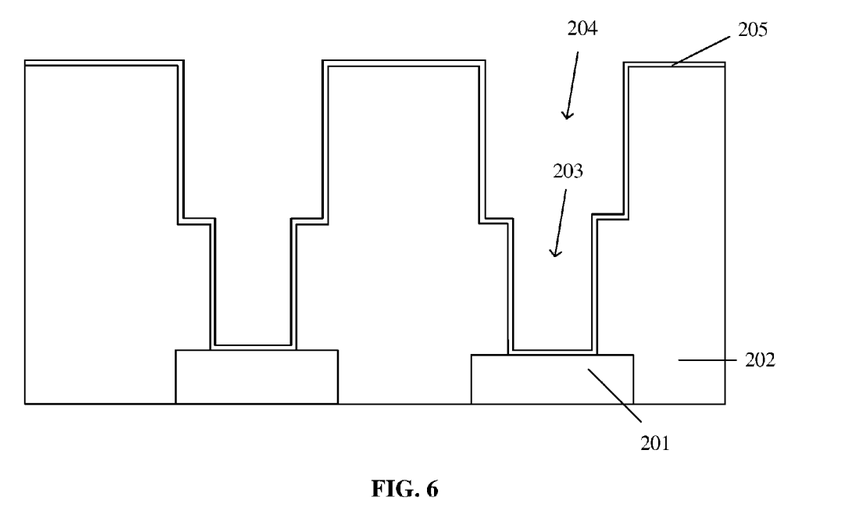

Further, as shown in FIG. 6, after forming the contact through holes 203 and the trenches 204, a first metal barrier layer 205 may be formed on the inner surfaces of the trenches 204 and the contact through holes 203. In one embodiment, the first metal barrier layer 205 is made of metal, such as Ta or Ti, etc. The thickness of the first metal barrier layer 205 may be relatively small to ensure the contact through holes 203 and the trenches 204 to be easily filled by a subsequent process.

Figure 7:
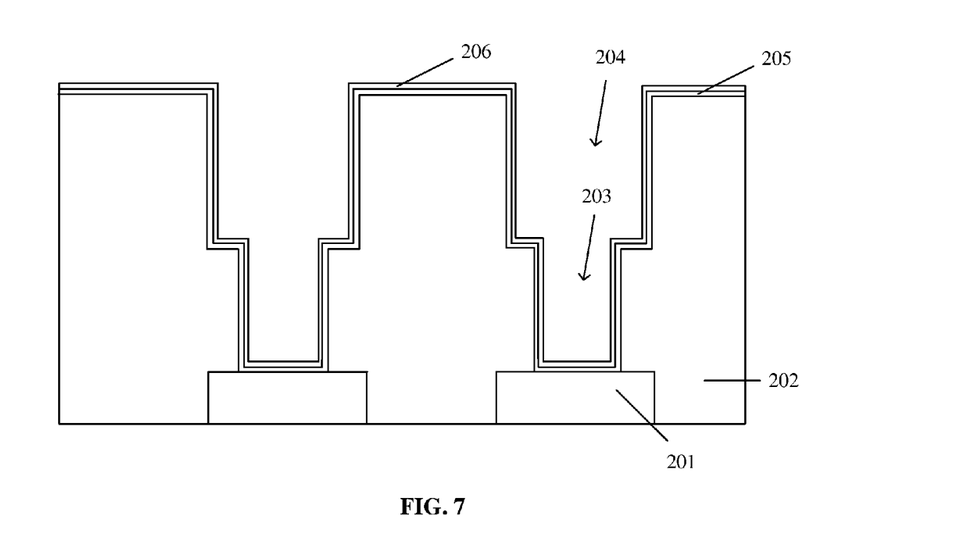

Further, as shown in FIG. 7, after forming the first metal barrier layer 205, a metal nitride barrier layer 206 may be formed on the inner surfaces of the trenches 204 and the contact through holes 203. The metal nitride barrier layer 206 may cover the first metal barrier layer 205.

Figure 8:
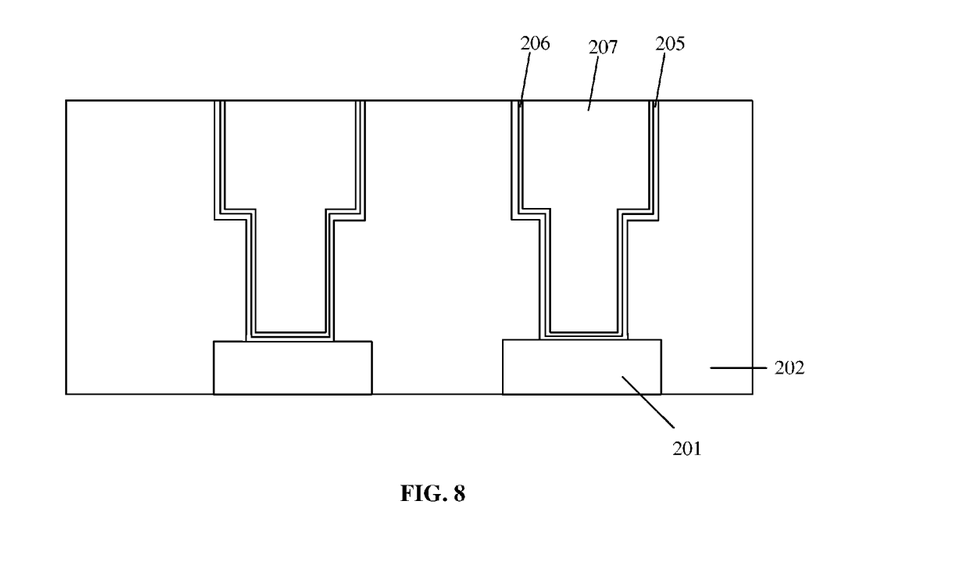

Further, as shown in FIG. 8, after forming the metal nitride barrier layer 206, a second metal 207 may be filled in the contact through holes 203 and the trenches 204. When the second metal 207 is made of copper, a copper seed layer (not shown) may be formed on the metal nitride barrier layer 206 firstly, and the second metal layer 207 may be formed on the copper seed layer by an electro-chemical plating process.

During the formation of the contact through holes 203 and the trenches 204, the surface of the first metal layer 201 exposed by the contact through holes 203 may be left with many contaminations. These contaminations may often be nitrogen or oxygen-containing; and may not be removed by subsequent processes. Thus, these contaminations may be covered, or sealed by subsequently formed layers; and the resistance between the first metal layer 201 and the second metal layer 207 may be increased.

In one embodiment, after forming the contact through-holes 203 and the trenches 204, the first metal barrier layer 205 may be formed on the inner surfaces of the contact through-holes 203 and the trenches 204. The first metal barrier layer 205 may be able to react with the oxygen or nitrogen-containing contaminations to form corresponding metal oxide or metal nitride. Thus, the contaminations may be eliminated.

After the contaminations are removed, when the metal nitride barrier 206 and the second metal layer are subsequently formed, the resistance between the first metal layer 201 and the second metal layer 207 may not be affected (or may be decreased compared with the structure having the contaminations). Thus, the RC delay issue may be solved; and the performance of the entire metal interconnect structure may be improved.

Accordingly, a metal interconnect structure may be formed by the disclosed methods. FIG. 8 illustrates a corresponding metal interconnect structure.

As shown in FIG. 8, the metal interconnect structure may include a first metal layer 201; a dielectric layer 202 formed over the first metal layer 201; a metal barrier layer 205 formed on the surface of the first metal layer 201 and on the inner surfaces of the dielectric layer 202; a metal nitride barrier layer 206 formed on the first metal barrier layer 205; and a second metal layer 207 formed on the first metal nitride barrier layer 206. The inner surfaces are the inner surfaces of the trenches and contact through holes formed in the dielectric layer 202. The detailed structures and intermediate structures are described above with respect to the fabrication processes.

Figure 16:
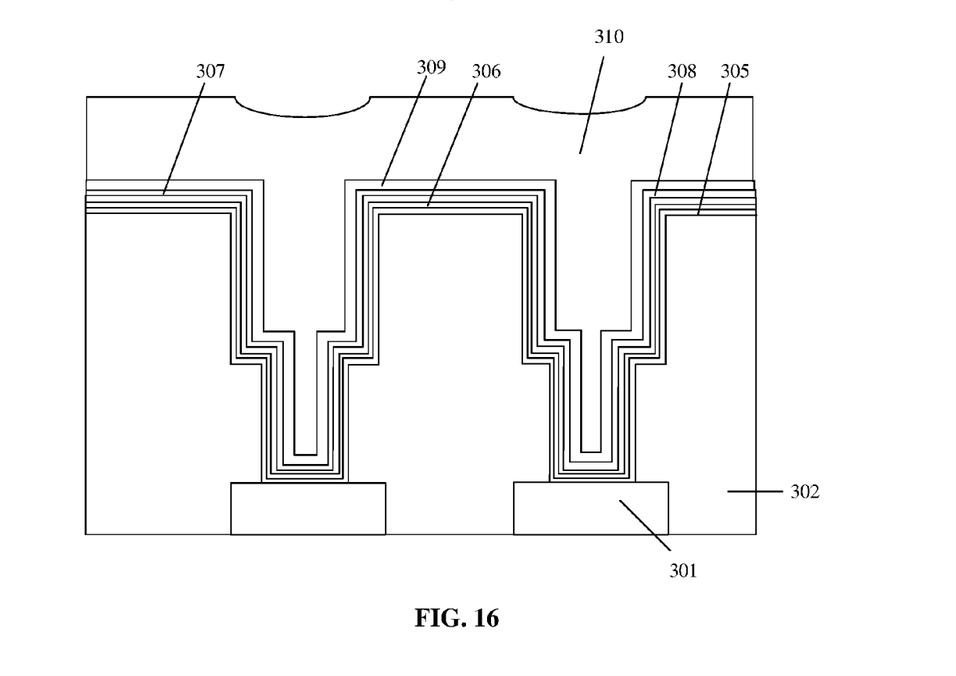
Figure 17:
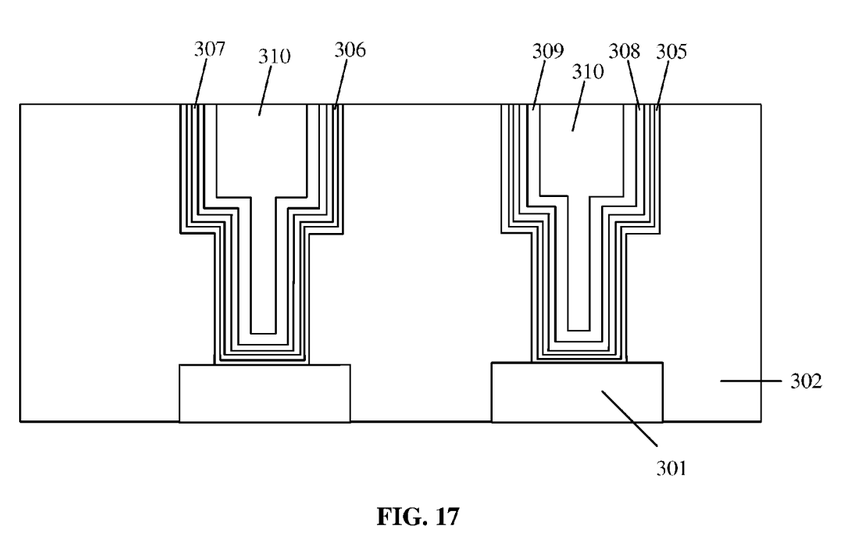
Figure 18:
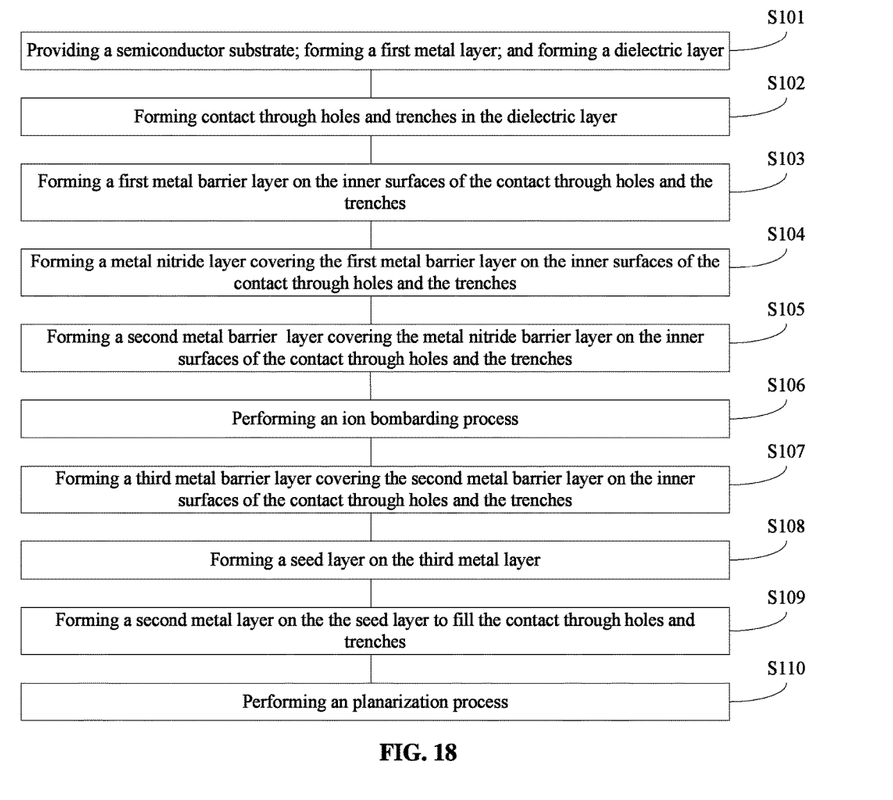
FIG. 18 illustrates an exemplary fabrication process of a metal interconnect structure consistent with the disclosed embodiments.

FIG. 18 illustrates another exemplary fabrication process of a metal interconnect structure consistent with the disclosed embodiments. FIGS. 9-17 illustrate semiconductor structures corresponding to certain stages of the exemplary fabrication.

Figure 9:
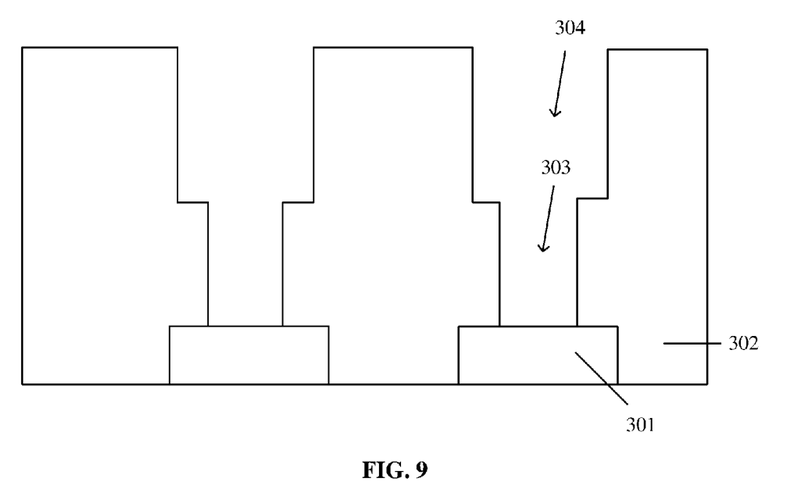
FIGS. 9-17 illustrate semiconductor structures corresponding certain stages of another exemplary fabrication process of a metal interconnect structure consistent with the disclosed embodiments.

A shown in FIG. 18, at the beginning of fabrication process, a semiconductor substrate with certain structures is provided (S101). FIG. 9 illustrates a corresponding semiconductor structure.

As shown in FIG. 9, a semiconductor substrate (not shown) is provided; and a first metal layer 301 is formed on the surface of the semiconductor substrate. Further, a dielectric layer 302 may be formed on the first metal layer 301.

The semiconductor substrate may be made of any appropriate semiconductor material, such as silicon, polysilicon, silicon on insulator (SOI), germanium on insulator (GOI), silicon germanium, carborundum, indium antimonite, lead telluride, indium arsenide, indium phosphide, gallium arsenide, gallium antimonite, alloy semiconductor, or a combination thereof. In one embodiment, the semiconductor substrate is made of silicon. The semiconductor substrate provides a base for subsequent structures and processes.

Further, semiconductor structures (not shown) may be formed on the semiconductor substrate. The semiconductor structures may be active semiconductor devices or passive semiconductor devices. The dielectric layer 302 may cover the first metal layer 301; and may also cover the semiconductor structures.

The first metal layer 301 may be electrically connected the semiconductor structures with other semiconductor structures, circuits, external semiconductor structures or external circuits, etc. The first metal layer 301 may be included in a metal interconnect structure, or may be connected to a metal interconnect structure.

The first metal layer 301 may be made of any appropriate material, such as copper, etc. Various processes may be used to form the first metal layer 301, such as a chemical vapor deposition (CVD) process, a physical vapor deposition (PVD) process, an atomic layer deposition (ALD) process, an electro-chemical plating (ECP) process, or a flowable CVD (FCVD) process, etc.

The dielectric layer 302 may be made of any appropriate material, such as low dielectric constant (low-K) material, or ultra-low-K material, etc. In one embodiment, the average dielectric constant (K) of the dielectric layer 302 may be in a range of approximately 2.0-3.0.

The thickness of the dielectric layer 302 may be any appropriate value. In one embodiment, the thickness of the dielectric layer 302 may be in a range of approximately 1500 Å-3000 Å. Various processes may be used to form the dielectric layer 302. In one embodiment, the dielectric layer 302 is formed by a CVD process.

Returning to FIG. 18, after forming the dielectric layer 302, contact through holes and trenches may be formed (S102). FIG. 9 illustrates a corresponding semiconductor structure.

As shown in FIG. 9, a plurality of contact through holes 303 and trenches 304 are formed in the dielectric layer 302. For illustrative purposes, two contact through holes 303 and two trenches 304 are shown. The contact through holes 303 may expose the surface of the first metal layer 301. The contact through holes 303 may be connected with the trenches 304; and present a Damascene morphology. The trenches 304 may be above the contact through holes 303.

The width of the contact through-holes 303 and the trenches 304 may be in a range of approximately 30 nm-100 nm. The depth of the contact through holes 303 and the trenches 304 may be in a range of approximately 100 nm-300 nm. In certain other embodiments, the width and depth of the contact through-holes 303 and the trenches 304 may be any other appropriate values according to different requirements. The contact through holes 303 and the trenches 304 may be formed by any appropriate processes, such as a photolithography process, and an etching process, etc.

Figure 10:
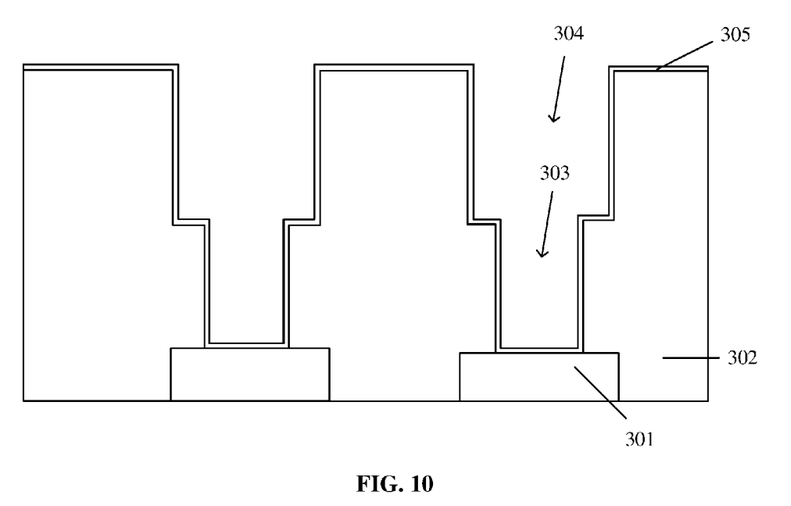

Returning to FIG. 18, after forming the contact through holes 303 and the trenches 304, a first metal barrier layer may be formed (S103). FIG. 10 illustrates a corresponding semiconductor structure.

As shown in FIG. 10, a first metal barrier layer 305 is formed on the inner surfaces of the trenches 304 and the contact through holes 303. The inner surfaces of the contact through holes 303 may include the side surfaces and the bottom surfaces of the contact through holes 303. The bottom surfaces of the contact through holes 303 may be the exposed surfaces of the first metal layer 301. The inner surfaces of the trenches 304 may include the side surfaces of the trenches 304 and the bottom surfaces of the trenches 304. The major portions of the bottom surfaces of the trenches 304 may connect with the contact through holes 303; and small portions of the bottoms surfaces of the trenches 304 may be have step-shape profile at the interface between the contact through holes 303 and the trenches 304. The cross-section of such a geometry may be referred to as a geometry of a Damascene structure.

The first metal barrier layer 305 may be made of any appropriate material, such as Ta, or Ti, etc. In one embodiment, the first metal barrier layer 305 is made of Ta. The activity of Ta or Ti may be relatively low. Thus, the first metal barrier layer 305 made of Ta or Ti may have a relatively low diffusion rate. Even the first metal barrier layer 305 is directly formed on the inner surfaces of the trenches 304 and the contact through holes 303, it may not adversely affect the performance of the metal interconnect structure.

The first metal barrier layer 305 may be formed by any appropriate process. In one embodiment, the first metal barrier layer 305 is formed by a PVD process. The DC power of the PVD process may be in a range of approximately 10 kW-30 kW. That is, the DC power applied on the semiconductor substrate may be in a range of approximately 10 kW-30 kW. Such a DC power range may ensure the first metal barrier layer 305 to directly cover the inner surfaces of the contact through holes 303 and the trenches 304.

During the formation of the contact through holes 303 and the trenches 304, nitrogen and/or oxygen containing contaminations may be formed on the surface of the first metal layer 301 exposed by the contact through holes 303. When the first metal barrier layer 305 is directly formed on the exposed surface of the first metal layer 301, the first metal barrier layer 305 may be able to react with the contaminations. That is, the metal Ta of the first metal barrier layer 305 may be able to react with the contaminations; and the contaminations may be removed.

A subsequently formed second metal layer is often made of copper. Copper is relatively active; and easy to diffuse. The first metal barrier layer 305 may be able to prevent the diffusion of copper. Thus, after forming the extra first metal barrier layer 305, the resistance between the first metal layer 301 and the subsequently formed second metal layer in the trenches 304 and the contact through holes 305 may be reduced; and the corresponding RC delay may be reduced.

The thickness of the first metal barrier layer 305 may be any appropriate value. In one embodiment, the thickness of the first metal barrier layer 305 may be in a range of approximately 2 Å-10 Å. Because the purpose for forming the first metal barrier layer 305 may be to remove the contaminations, the thickness of the first metal barrier layer 305 may be greater than 2 Å so as to ensure the contaminations to be entirely removed. Further, to avoid affecting the subsequent filling of the contact through holes 303 and the trenches 304, the thickness of the first metal barrier layer 305 may be smaller than 10 Å.

Figure 11:
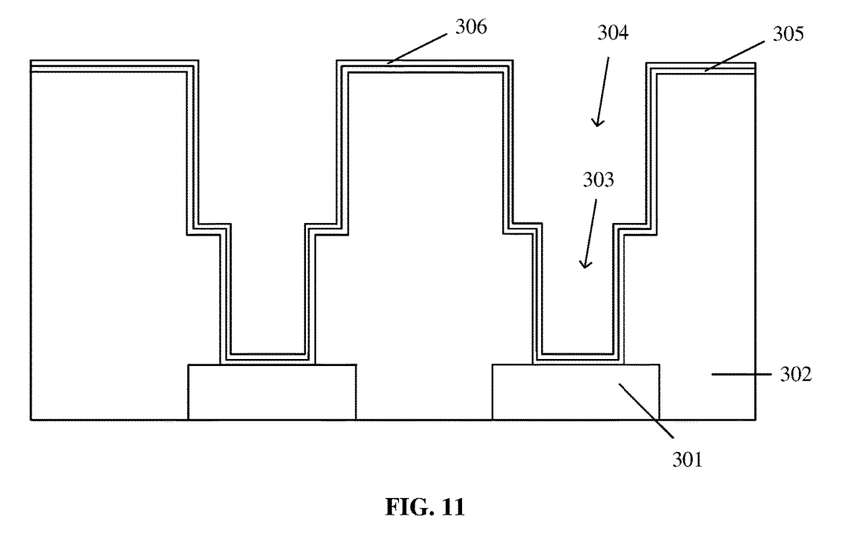

Returning to FIG. 18, after forming the first metal barrier layer 305, a metal nitride barrier layer may be formed (S104). FIG. 11 illustrates a corresponding semiconductor structure.

As shown in FIG. 11, a metal nitride barrier layer 306 is formed on the inner side surfaces of the contact through holes 303 and the trenches 304. That is, the metal nitride barrier layer 306 may cover the first metal barrier layer 305.

The metal nitride barrier layer 306 may be made of any appropriate material, such as TaN, or TiN, etc. In one embodiment, the metal nitride barrier layer 306 is made of TaN.

The thickness of the metal nitride barrier layer 306 may be any appropriate value. In one embodiment, the thickness of the metal nitride barrier layer 306 is in a range of approximately 20 Å-50 Å. The metal nitride barrier 306 may function as a diffusion barrier layer. Further, the thickness of the metal nitride barrier layer 306 may also affect the resistance of the final metal interconnect structure. To ensure the metal nitride barrier layer 306 to be able to have the diffusion barrier function and meet the corresponding resistance requirement, the thickness of the metal nitride barrier layer 306 may be in the range of 20 Å-50 Å.

Various processes may be used to form the metal nitride barrier layer 306. In one embodiment, because the PVD method may introduce fewer contaminations, the metal nitride barrier layer 306 is formed by a PVD process.

However, the PVD process may have a relatively low step-coverage. Thus, the thickness of the metal nitride layer 306 on the side surfaces may be smaller than the thickness of the metal nitride layer 306 on the bottom surfaces of the contact through holes 303. In certain embodiments, it may only need to control the thickness of the metal nitride barrier layer 306 on the bottom surfaces of the contact through holes 303 to be in the range of 20 Å-50 Å. Under such a condition, the thickness of the metal nitride layer 306 on the side surfaces of the contact through holes 303 may meet the thickness requirements. At the same time, the thickness of the metal nitride layer 306 on the side surfaces of the trenches 304 may also meet the thickness requirements.

Figure 12:
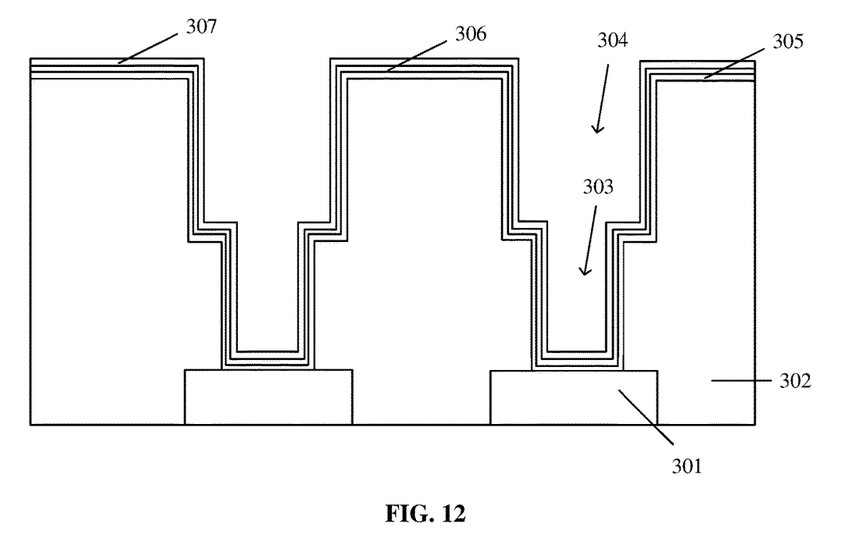

Returning to FIG. 18, after forming the metal nitride barrier layer 306, a second metal barrier layer may be formed (S105). FIG. 12 illustrates a corresponding semiconductor structure.

As shown in FIG. 12, a second metal barrier layer 307 is formed on the inner surfaces of the contact through holes 303 and the trenches 304. That is, the second metal barrier layer 307 is formed on the metal nitride barrier layer 306, and may cover the metal nitride barrier layer 307. The first metal barrier layer 305, the metal nitride barrier layer 306 and the second metal barrier layer 307 may be referred as to a sandwiched-barrier structure.

Disposing the second metal barrier layer 307 may be able to increase the connection quality between the metal nitride barrier layer 307 and the subsequently formed second metal layer. Further, the second metal barrier layer 307 may also be able to prevent the diffusion of the subsequently formed second metal layer.

Because the subsequently formed second metal layer may be made of copper; and the adhesion force between copper and the metal nitride barrier layer 306 may be relatively weak, before forming the second metal layer, the second metal barrier layer 307 may be formed. Further, the metal in the second metal barrier layer 307 may be identical to the metal in the metal nitride barrier layer 306. For example, in one embodiment, the metal nitride barrier layer 306 is made of TaN, the second metal barrier layer 307 is made of Ta. Such a selection of the metal may be able to cause the metal nitride layer 306 and the subsequently formed second metal layer to have desired connection and adhesion. In certain other embodiments, if the metal nitride barrier layer is made of TiN, the second metal barrier layer 307 may be made of Ti.

In one embodiment, the thickness of the second metal barrier layer 307 may be in a range of approximately 20 Å-50 Å. The second metal barrier layer 307 may be formed by a PVD process. The portion of the second metal barrier 307 on the side surfaces of the contact through holes 307 may usually be thinner than the portion of the second metal barrier layer 307 on the bottoms of the contact through holes 303. In certain embodiments, it may only need to control the thickness of the portion of the second metal barrier layer 307 on the bottoms of the contact through holes 303 to be in a range of approximately 20 Å-50 Å.

Figure 13:
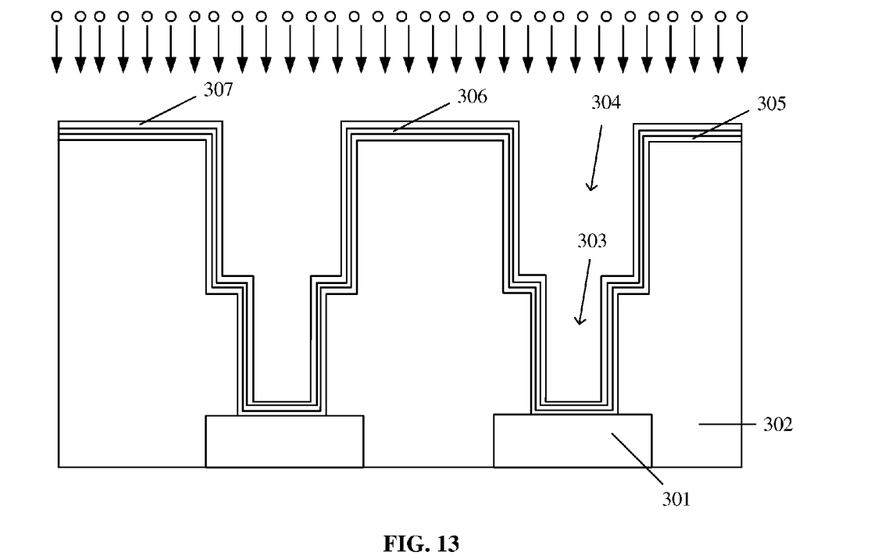

Returning to FIG. 18, after forming the second metal barrier layer 307, an ion bombarding process may be performed (S106). FIG. 13 illustrates a corresponding semiconductor structure.

As shown in FIG. 13, an ion bombarding process is performed on the second metal barrier layer 307 and the metal nitride barrier layer 306 on the bottoms of the contact through holes 303. One of the purposes of the ion bombarding process may be to thin the sandwiched structure on the bottoms of the contact through holes 303. The sandwiched structure may include the second metal barrier layer 307, the metal nitride barrier layer 306, and the first metal barrier layer 305. The first metal barrier layer 305 and the second metal barrier layer 307 may be made of metal. Thus, the resistances of the first metal barrier layer 305 and the second metal barrier layer 307 may be relatively low. However, the metal nitride barrier layer 306 itself may have a relatively large resistance. Thus, thinning the sandwiched structure on the bottoms of the contact through holes 303 may reduce the total resistance of the sandwiched structure.

Various kinds of ions may be used in the ion bombarding process. In one embodiment, argon ions are used in the ion bombarding process (the small circles illustrated in FIG. 13 represent argon ions, not labeled). The arrow direction in FIG. 13 illustrates the bombarding direction of the argon ions. The argon ion bombarding process is a physical process. Because the argon ion bombarding process is directional, it may not change the thickness of the structures on the side surfaces of the trenches 304 and the contact through holes 303.

In one embodiment, the flow rate of argon gas used in the argon ion bombarding process may be in a range of approximately 5 sccm-50 sccm. The AC power of the argon ion bombarding process may be in a range of approximately 500 W-1000 W. The time of the argon ion bombarding process may be in a range of approximately 2 s-15 s. It the bombarding time is too long, the dielectric layer 302 may be damaged. If the bombarding time is too short, the thinning effect may be affected.

Specifically, in the argon ion bombarding apparatus, the radio frequency (RF) power applied on the radio frequency coil may be in a range of approximately 1000 kW-3000 kW. Such a RF power may ionize the argon gas. The AC power applied on the wafer (or the semiconductor substrate) may be in a range of approximately 500 W-1000 W. Such an AC power may be used to accelerate the argon ions to perform the ion bombarding process.

In one embodiment, the total thickness of the second metal barrier layer 307, the metal nitride barrier layer 306, and the first metal barrier layer 305 may be thinned to approximately 12 Å-50 Å by the argon ion bombarding process. On one hand, to cause the resistance between the first metal layer 301 and the subsequently formed second metal to be relatively small, it may need to thin the total thickness of the sandwiched structure below 50 Å.

On the other hand, to be able to thin the portion the metal nitride layer 306 on the bottoms of the contact through holes 303, it may need to remove the entire portion of the second metal barrier layer 307 on the bottoms of the contact through holes 303.

However, to avoid thinning the portion of the metal nitride barrier layer 306 too much at some sloped positions, i.e., the contact regions between the contact through holes 303 and the trenches 304, and to prevent the argon ion bombarding process from damaging the dielectric layer 302, the thickness of the portion of the metal nitride barrier layer 306 may be kept greater than approximately 10 Å. Thinning the metal nitride barrier layer 306 too much may cause the metal nitride barrier layer 306 not to have enough barrier ability.

In one embodiment, the ion bombarding process may not thin the first metal barrier layer 305. If the ion bombarding process starts thinning the first metal barrier layer 305, the metal nitride barrier layer 306 may be completely removed.

Figure 14:
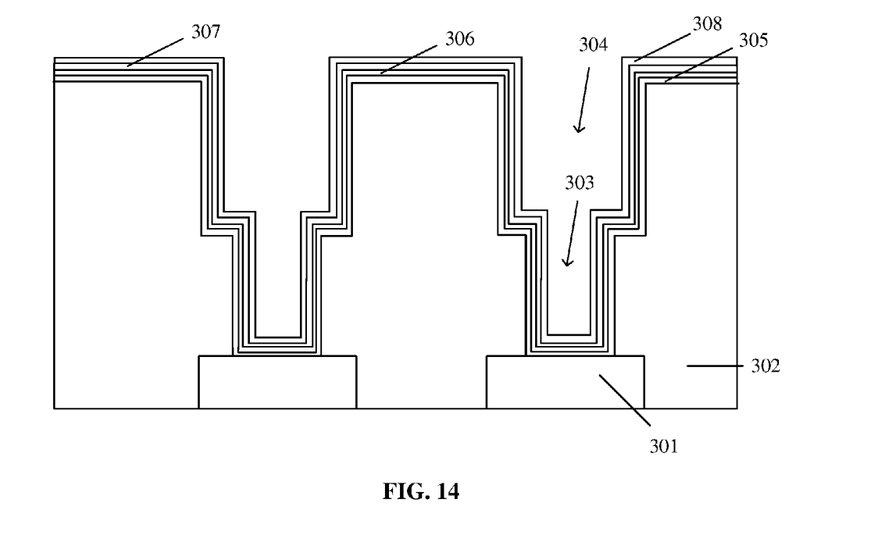

Returning to FIG. 18, after the ion bombarding process, a third metal barrier layer may be formed (S107). FIG. 14 illustrates a corresponding semiconductor structure.

As shown in FIG. 14, a third metal barrier layer 308 is formed on the inner surfaces of the contact through holes 303 and the trenches 304. The third metal barrier layer 308 may cover the ion bombarded second metal barrier layer 307.

The third metal barrier layer 308 may also be able to prevent the diffusion of the subsequently formed metal layer 310. The third metal barrier layer 308 may also facilitate the subsequent formation of a seed layer. The third metal barrier layer 308 may be made of any appropriate material, such as Ta, and Ti, etc. In one embodiment, the third metal barrier layer 308 is made of Ta.

In one embodiment, the thickness of the third metal barrier layer 308 may be in a range of approximately 10 Å-30 Å. Such a thickness range may facilitate the subsequent formation of a copper seed layer; and may facilitate to subsequently fill the trenches 304 and the contact through holes 303.

The third metal barrier layer 308 may be formed by any appropriate processes. In one embodiment, a PVD process is used to form the third metal barrier layer 308. Because the thickness of the portion of the third metal barrier layer 308 on the side surfaces may be greater than on the bottoms, it may only need the thickness of the portion of the third metal barrier layer 308 to be in a range of approximately 10 Å-30 Å.

Figure 15:
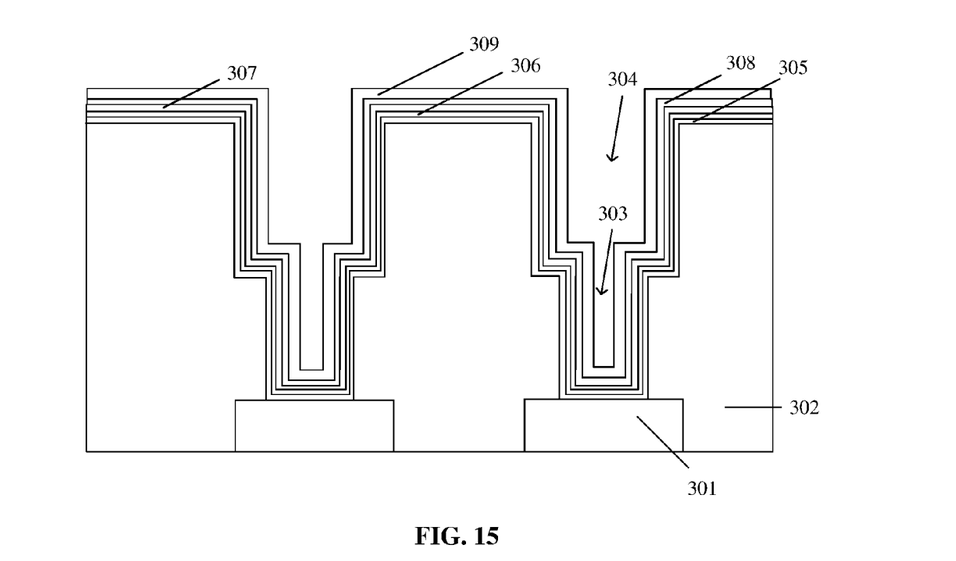

Returning to FIG. 18, after forming the third metal barrier layer 308, a seed layer may be formed (S108). FIG. 15 illustrates a corresponding semiconductor structure.

As shown in FIG. 15, a seed layer 309 is formed on the inner surfaces of the contact through holes 303 and the trenches 304. That is, the seed layer 309 may cover the third metal barrier layer 308. In one embodiment, the seed layer 309 may be made of copper. Thus, the seed layer 309 may be referred to as a copper seed layer 309.

Various processes may be used to form the seed layer 309. In one embodiment, the seed layer 309 is formed by a PVD process. The thickness of the seed layer 309 may be in a range of approximately 200 Å-800 Å.

Returning to FIG. 18, after forming the seed layer 309, a second metal layer may be formed (S109). FIG. 16 illustrates a corresponding semiconductor structure.

As shown in FIG. 16, a second metal layer 310 is formed. The second metal layer 310 may fill the contact through holes 303 and the trenches 304. Further, the second metal layer 310 may cover the seed layer 309. The second metal layer 310 may be higher than the trenches 304 and the contact through holes 303 (or the top surface of the dielectric layer 302).

The second metal layer 310 may be made of any appropriate material. Various processes may be used to form the second metal layer 310. In one embodiment, the second metal layer 310 is formed by an electro-chemical plating (ECP) process.

Returning to FIG. 18, after forming the second metal layer 310, a planarization process may be performed (S110). FIG. 17 illustrates a corresponding semiconductor structure.

As shown in 17, a planarization process is performed to remove the structures higher than the surface of the dielectric layer 302. Thus, a planar surface is obtained. The planarization process may be any appropriate process, such as a chemical mechanical polishing process, or a physical mechanical polishing process, etc. In one embodiment, a chemical mechanical polishing process is used to remove the structures on the surface of the dielectric layer 302 to expose the surface of the dielectric layer 302.

Accordingly, a metal interconnect structure may be formed by the disclosed fabrication methods and processes. FIG. 17 illustrates a corresponding metal interconnect structure.

As shown in FIG. 17, the metal interconnect structure may include a first metal layer 301; and a dielectric layer 302 formed over the first metal layer 301. The metal interconnect structure may also include a first metal barrier layer 305 formed in the dielectric layer 302 and on the first metal layer 301; and a metal nitride barrier layer 306 formed on the first metal barrier layer 305. Further, the metal interconnect structure may include a second metal barrier layer 307 formed on the metal nitride barrier layer 306 and a third metal barrier layer 308 formed on the second metal barrier layer 307. Further, the metal interconnect structure may also include a seed layer 309 formed on the third metal barrier layer 308; and a second metal layer 310 formed on the seed layer 309. The first metal barrier layer 305 is formed on the inner surfaces of contact through holes exposing the surface of the first metal layer 301 and trenches connecting with the contact through holes formed in the dielectric layer 302. The detailed structures and intermediate structures are described above with respect to the fabrication processes.

According to the previous descriptions, there may be two reasons causing the first metal layer and the second metal layer of the metal interconnect structures formed by the existing methods to have a relatively large resistances. The first reason is related to the oxygen and nitrogen-containing contaminations on the inner surfaces of the trenches and the contact though holes. The oxygen and nitrogen-containing contaminations may not react with the metal nitride barrier layer. Thus, the oxygen and nitrogen-containing contaminations may always exist in between the metal nitride barrier layer and the second metal layer; and increase the resistance between the metal nitride barrier layer and the second metal layer. That is, the resistance between the first metal layer and the second metal layer may be increased.

The second reason is related to the thickness of the metal nitride barrier layer. In the existing methods, to reduce the contaminations, the metal nitride layer is often formed by a PVD process. The resistance of the metal nitride layer itself is relatively large. Further, the step-coverage of the PVD process may be relatively low. To ensure the portion of the metal nitride barrier layer on the inner surfaces of the trenches and contact through holes to have an enough thickness, the portion of the metal nitride barrier layer on the bottom of the contact through holes may be relatively thick.

The second metal layer may be subsequently formed on the portion of the metal nitride barrier layer on the bottom of the contact through holes. Thus, the resistance between the first metal layer and the second metal layer may be increased.

To overcome the second reason, thinning the metal nitride layer may be an acceptable approach to reduce the resistance. However, as mentioned previously, the step-coverage of the PVD process may be relatively low. If the metal nitride barrier layer is thinned too much, the portion of the metal nitride barrier layer on the side surfaces may be too thin; and the metal nitride barrier layer may be unable to effectively prevent the metal diffusion; and the corresponding structure may have an un-acceptable electro-migration.

In the disclosed methods for fabricating the metal interconnect structures, the two reasons are considered simultaneously. Firstly, a first metal barrier layer 305 may be directly formed on the side surfaces of the contact through holes 303 and the trenches 304. The first metal barrier layer 305 may react with oxygen and nitrogen-containing contaminations. Thus, the contaminations may be removed; and the adverse effect to the resistance may be reduced. Accordingly, the resistance between the first metal layer 301 and the second metal layer 310 may be reduced. Further, an ion bombarding process may be used to thin the portion of the metal nitride barrier layer 306 on the bottoms of the contract through holes 303. Thus, the resistance between the first metal layer 301 and the second metal layer 310 may be further reduced.

Thus, the disclosed methods may be able to ensure the metal nitride barrier layer 306 to have a desired diffusion barrier ability. At the same time, it may also be able to reduce the RC delay in the metal interconnect structures; and the performance of the entire metal interconnect structure may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a metal interconnect structure, comprising:
    providing a semiconductor substrate having a surface;
    forming a first metal layer on the surface of the semiconductor substrate;
    forming a dielectric layer on the first metal layer;
    forming contact through holes exposing a surface of the first metal layer, and trenches being over the contact through holes and connecting with the contact through holes in the dielectric layer;
    forming a first metal barrier layer on inner surfaces of the trenches and the contact through holes;
    forming a metal nitride barrier layer covering the first metal barrier layer on the inner surfaces of the trenches and the contact through holes;
    forming a second metal barrier covering the metal nitride barrier layer on the inner surfaces of the trenches and the contact through holes;
    performing an ion bombarding process on the second metal barrier layer and the metal nitride barrier layer; and
    forming a second metal layer to fill the trenches and the contact through holes.

2. The method according to claim 1, after the ion bombarding process, further comprising:
    forming a third metal barrier covering the second metal barrier layer on the inner surfaces of the trenches and the contact through holes.

3. The method according to claim 2, after forming the third metal barrier layer, further comprising:
    forming a seed layer covering the third metal barrier layer on the inner surfaces of the trenches and the contact through holes.

4. The method according to claim 3, wherein:
    the seed layer is made of copper; and
    a thickness of the seed layer is in a range of approximately 200 Å-800 Å.

5. The method according to claim 3, wherein:
    the seed layer is formed by a physical vapor deposition process; and
    a DC power of the physical vapor deposition process is in a range of approximately 10 kW-50 kW.

6. The method according to claim 2, wherein:
    a thickness of the third metal barrier layer is in a range of approximately 20 Å-50 Å.

7. The method according to claim 2, wherein:
    the first metal barrier layer is made of one of Ta and Ti;
    the second metal barrier layer is made of one of Ta and Ti;
    the third metal barrier layer is made of one of Ta and Ti; and
    the metal nitride barrier layer is made of one of TaN and TiN.

8. The method according to claim 1, wherein:
    the ion bombarding process is an argon ion bombarding process,
    a flow rate of argon gas is in a range of approximately 5 sccm-50 sccm;
    an AC power is in a range of approximately 500 W-1000 W; and
    a processing time of the argon ion bombarding process is in a range of approximately 2 s-5 s.

9. The method according to claim 1, wherein:
    a thickness of the second metal barrier layer is in a range of approximately 20 Å-50 Å.

10. The method according to claim 1, wherein:
    the first metal barrier layer formed by a physical vapor deposition process; and
    a DC power of the physical vapor deposition process is in a range of approximately 10 kW-30 kW.

11. The method according to claim 1, wherein forming the second metal layer comprises:
    filling the second metal layer in the trenches and the contact through holes; and
    performing a planarization process.

12. The method according to claim 11, wherein:
    the second metal layer is formed by an electro-chemical plating process.

13. The method according to claim 1, wherein:
    a width of the trenches and the contact through holes is in a range of approximately 30 nm-100 nm; and
    a depth of the trenches and the contact through-holes is in a range of approximately 100 nm-300 nm.

14. The method according to claim 1, wherein:
    the first metal barrier layer formed by a physical vapor deposition process; and
    a DC power of the physical vapor deposition process is in a range of approximately 10 kW-30 kW.

15. The method according to claim 1, wherein forming the second metal layer comprises:
   filling the second metal layer in the trenches and the contact through holes; and
   performing a planarization process.

16. The method according to claim 1, wherein:
   a width of the trenches and the contact through holes is in a range of approximately 30 nm-100 nm; and
   a depth of the trenches and the contact through-holes is in a range of approximately 100 nm-300 nm.

* * * * *